United States Patent
Okude

(10) Patent No.: US 11,558,033 B2
(45) Date of Patent: Jan. 17, 2023

(54) FILTER CIRCUIT AND COMPOSITE FILTER DEVICE

(71) Applicant: Murata Manufacturing Co., Ltd., Nagaokakyo (JP)

(72) Inventor: Takayuki Okude, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 232 days.

(21) Appl. No.: 16/912,736

(22) Filed: Jun. 26, 2020

(65) Prior Publication Data

US 2021/0036687 A1    Feb. 4, 2021

(30) Foreign Application Priority Data

Jul. 29, 2019   (JP) .............................. JP2019-138691

(51) Int. Cl.
| | |
|---|---|
| *H03H 9/64* | (2006.01) |
| *H03H 9/60* | (2006.01) |
| *H01Q 1/50* | (2006.01) |
| *H03H 9/205* | (2006.01) |
| *H03H 9/62* | (2006.01) |

(52) U.S. Cl.
CPC .............. *H03H 9/605* (2013.01); *H01Q 1/50* (2013.01); *H03H 9/205* (2013.01); *H03H 9/62* (2013.01); *H03H 9/64* (2013.01)

(58) Field of Classification Search
CPC .......... H03H 9/605; H03H 9/205; H03H 9/64; H03H 9/62; H01Q 1/50
See application file for complete search history.

(56) References Cited

U.S. PATENT DOCUMENTS

| | | | |
|---|---|---|---|
| 2004/0100342 A1* | 5/2004 | Nishihara | .............. H03H 9/568 333/133 |
| 2010/0110940 A1 | 5/2010 | Hara et al. | |
| 2018/0159506 A1 | 6/2018 | Ito | |

FOREIGN PATENT DOCUMENTS

| | | | |
|---|---|---|---|
| JP | 2003332884 A | * | 3/2011 |
| WO | 2009/025055 A1 | | 2/2009 |
| WO | 2016/190216 A1 | | 12/2016 |
| WO | WO 2018123775 A1 | * | 7/2018 |

* cited by examiner

*Primary Examiner* — Dinh T Le
(74) *Attorney, Agent, or Firm* — Keating & Bennett, LLP

(57) ABSTRACT

A filter circuit includes a plurality of first resonators provided in a series arm, a plurality of second resonators provided in a parallel arm, and at least one or more third resonators that are electrically connected in series with each other and are electrically connected in parallel with the first resonators in the series arm. An anti-resonant frequency of the third resonators is lower than an anti-resonant frequency of the second resonators. A combined capacitance of the at least one or more third resonators electrically connected in series with each other is smaller than an electrostatic capacitance of the second resonators.

20 Claims, 7 Drawing Sheets

FILTER CIRCUIT AND COMPOSITE FILTER DEVICE

CROSS REFERENCE TO RELATED APPLICATIONS

This application claims the benefit of priority to Japanese Patent Application No. 2019-138691 filed on Jul. 29, 2019. The entire contents of this application are hereby incorporated herein by reference.

BACKGROUND OF THE INVENTION

1. Field of the Invention

The present invention relates to a filter circuit and a composite filter device.

2. Description of the Related Art

Radio communication devices in the related art, such as cellular phones include respective filter circuits for filtering a specific signal. For example, International Publication No. 2009/025055 discloses a technique regarding a ladder filter circuit. The ladder filter circuit includes a series arm connecting an input terminal and an output terminal and a parallel arm having one end connected to the series arm and the other end connected to the ground. Various resonators are disposed in the series arm and the parallel arm. International Publication No. 2009/025055 discloses a technique for providing a filter circuit having sharp cut-off characteristics by connecting a third resonator and a first resonator in the series arm in parallel with each other for the effective use of a frequency band.

However, the technique disclosed in International Publication No. 2009/025055 focuses on only the resonant frequency and the anti-resonant frequency of the third resonator connected to the first resonator to provide the sharp cut-off characteristics of the filter circuit. The anti-resonant frequency of the third resonator affects the cut-off characteristics of the filter circuit. However, in the filter circuit disclosed in International Publication No. 2009/025055, the anti-resonant frequency of the third resonator is fixed to the anti-resonant frequency of a second resonator disposed in the parallel arm. It is therefore considered that there is room for the improvement of cut-off characteristics of the filter circuit in the pass band.

SUMMARY OF THE INVENTION

Preferred embodiments of the present invention provide filter circuits and composite filter device with cut-off characteristics that are able to be significantly improved on the lower-frequency side of a pass band.

A filter circuit according to a preferred embodiment of the present invention includes a plurality of first resonators provided in a series arm, a plurality of second resonators provided in a parallel arm, and at least one or more third resonators that are electrically connected in series with each other and are electrically connected in parallel with the first resonators in the series arm. An anti-resonant frequency of the third resonators is lower than an anti-resonant frequency of the second resonators. A combined capacitance of the at least one or more third resonators electrically connected in series with each other is smaller than an electrostatic capacitance of the second resonators.

According to preferred embodiments of the present invention, filter circuits and composite filter devices are each able to be provided with cut-off characteristics that are significantly improved on the lower-frequency side of a pass band.

The above and other elements, features, steps, characteristics and advantages of the present invention are described in the following detailed description of the preferred embodiments with reference to the attached drawings.

DETAILED DESCRIPTION OF THE PREFERRED EMBODIMENTS

Figure 1:
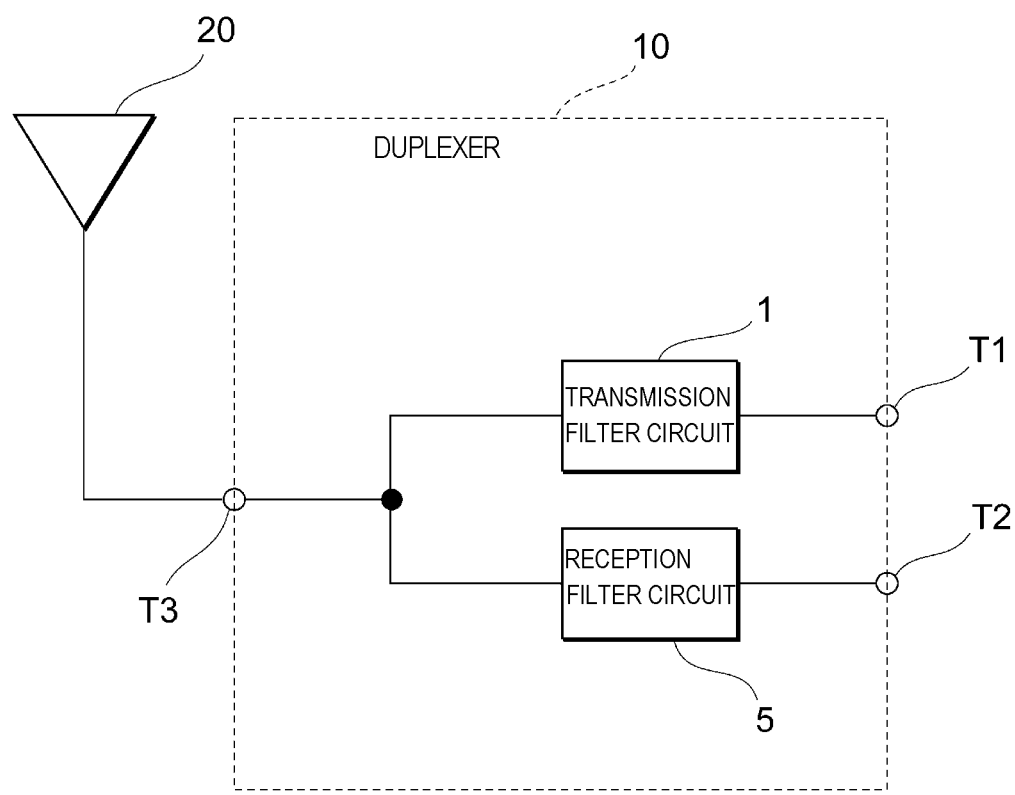
FIG. 1 is diagram showing a duplexer including a transmission filter circuit according to a first preferred embodiment of the present invention.

Preferred embodiments of the present invention will be described with reference to the accompanying drawings. In the drawings, the components represented by the same reference numeral have the same or similar features.

1. First Embodiment 1-1. Configuration of Duplexer

FIG. 1 is a diagram showing a duplexer 10 including a filter circuit according to a first preferred embodiment of the present invention. The duplexer 10 according to the first preferred embodiment is included in, for example, a mobile communication device, such as a cellular phone.

As shown in FIG. 1, the duplexer 10 includes, for example, a transmission filter circuit 1, a reception filter circuit 5, a transmission input terminal T1, a reception output terminal T2, and a common terminal T3. The common terminal T3 defines and functions as the transmission output terminal of the transmission filter circuit 1 and the reception input terminal of the reception filter circuit 5. The duplexer 10 is electrically connected to an antenna 20 via the common terminal T3.

A transmission signal output from a transmission circuit (not shown) is supplied to the transmission filter circuit 1 via the transmission input terminal T1. The transmission filter circuit 1 passes a signal in a predetermined frequency band from the transmission input terminal T1 to the common terminal T3 and attenuating a signal in the other frequency band. The transmission signal that has passed through the transmission filter circuit 1 is transmitted from the antenna 20 to a base station via the common terminal T3.

A reception signal that has been received from the base station by the antenna 20 is supplied to the reception filter circuit 5 via the common terminal T3. The reception filter circuit 5 passes a signal in a predetermined frequency band and attenuating a signal in the other frequency band. The reception signal that has passed through the reception filter circuit 5 is supplied to a reception circuit (not shown) via the reception output terminal T2.

In the first preferred embodiment, a case will be described where a filter circuit according to a preferred embodiment of the present invention is applied to the transmission filter circuit 1.

1-2. Configuration of Transmission Filter Circuit

Figure 2:
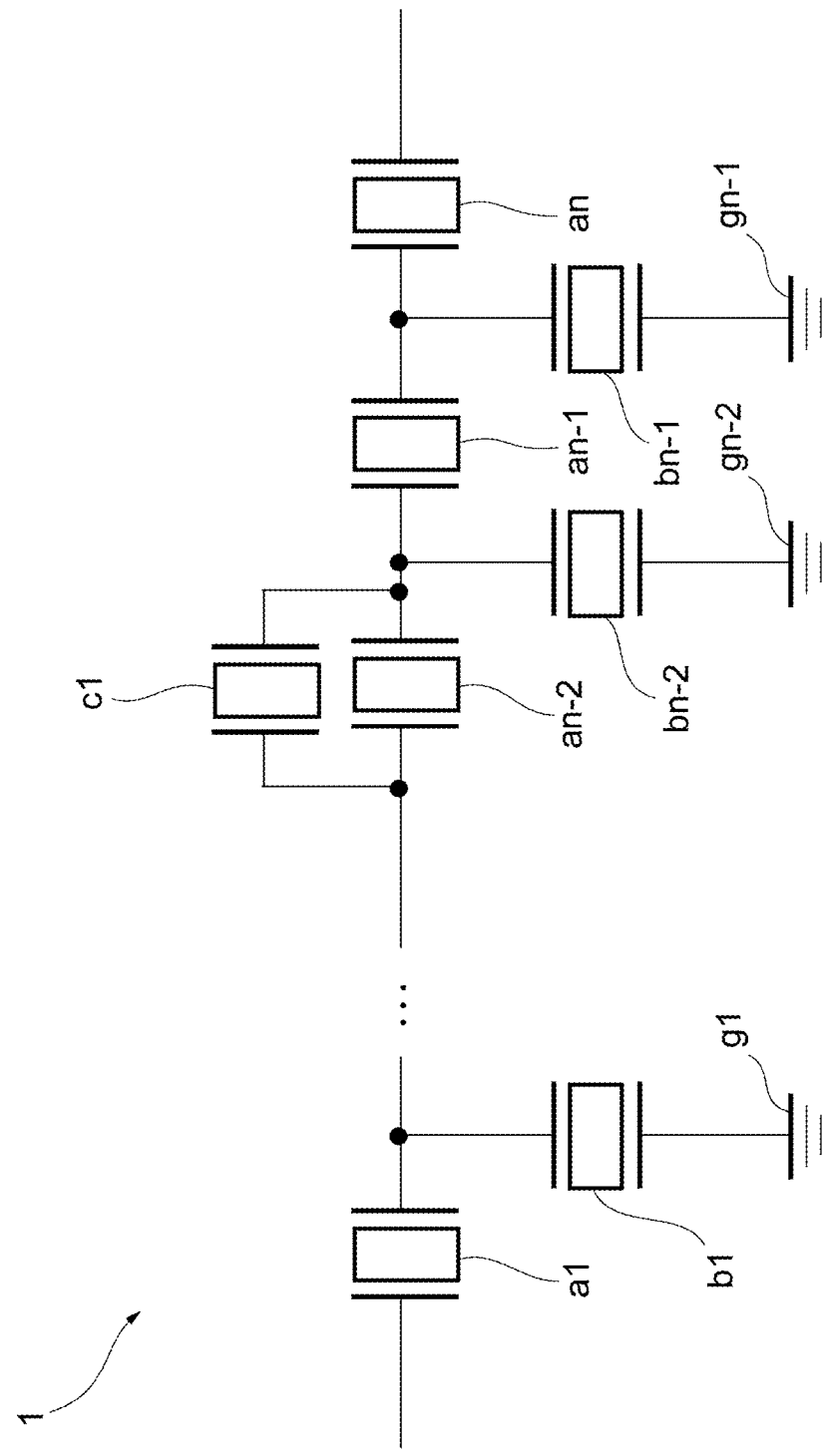
FIG. 2 is a diagram showing a transmission filter circuit according to the first preferred embodiment of the present invention.
Figure 5:
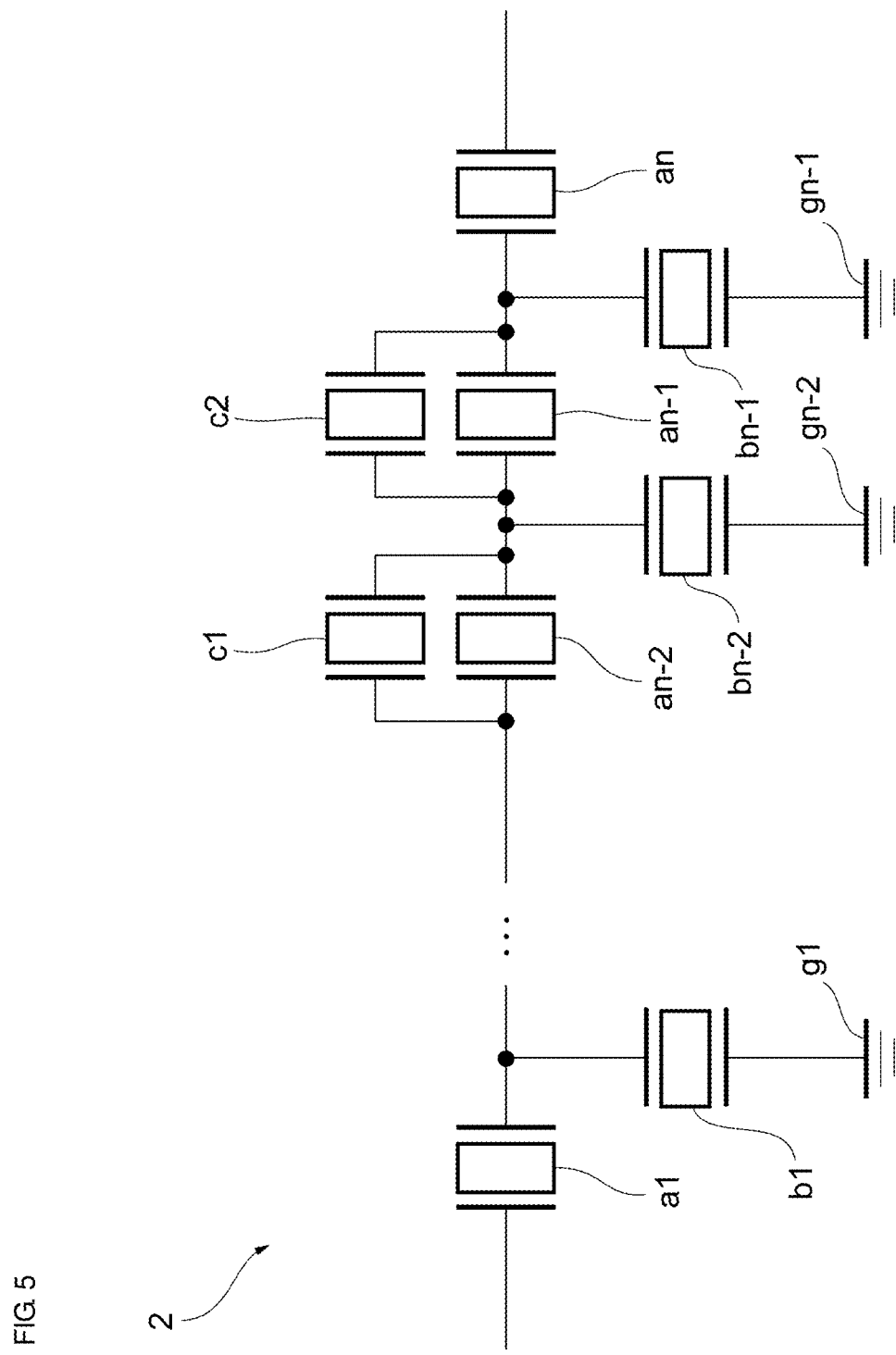
FIG. 5 is a diagram showing a transmission filter circuit according to a second preferred embodiment of the present invention.
Figure 6:
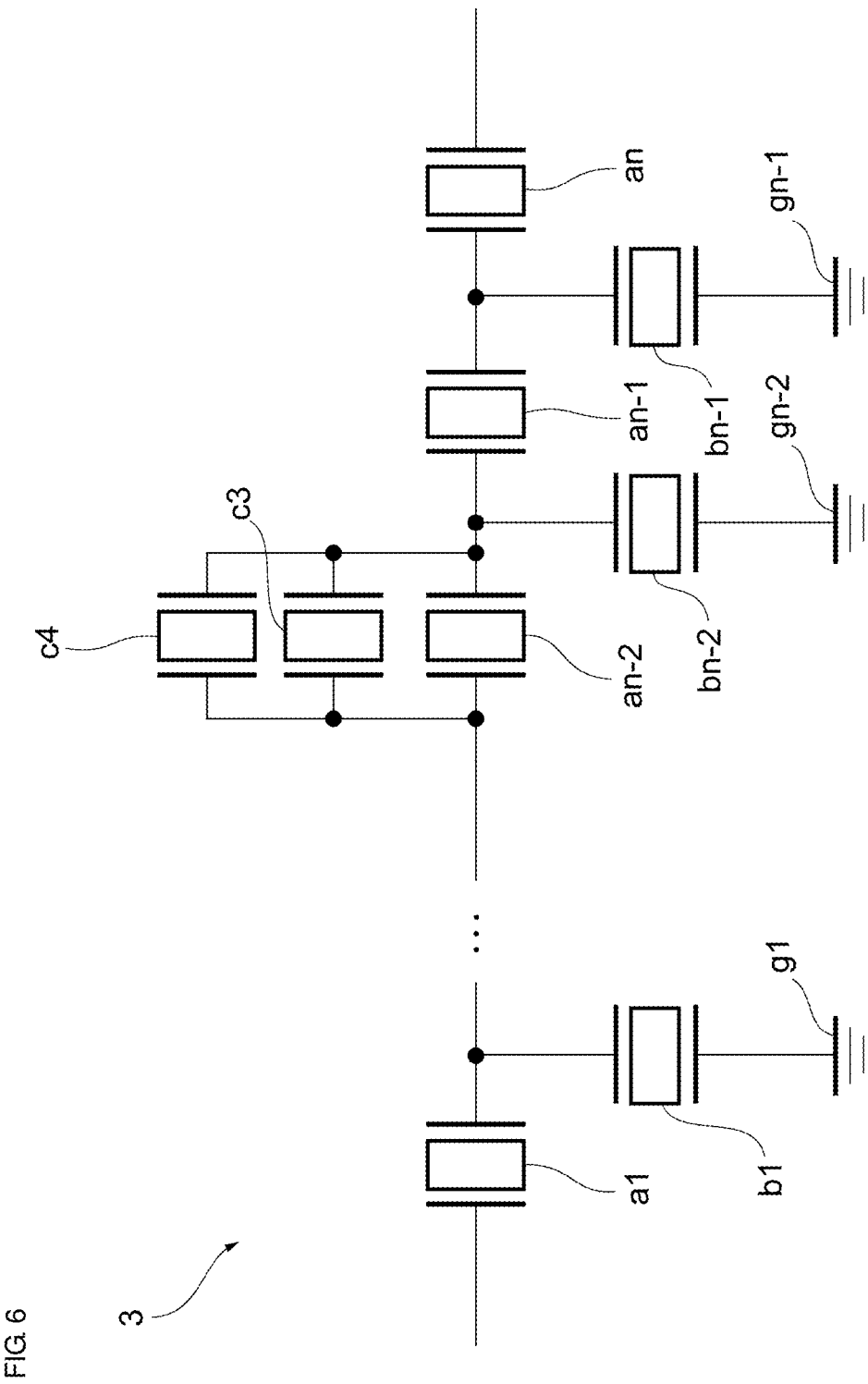
FIG. 6 is a diagram showing a transmission filter circuit according to a third preferred embodiment of the present invention.
Figure 7:
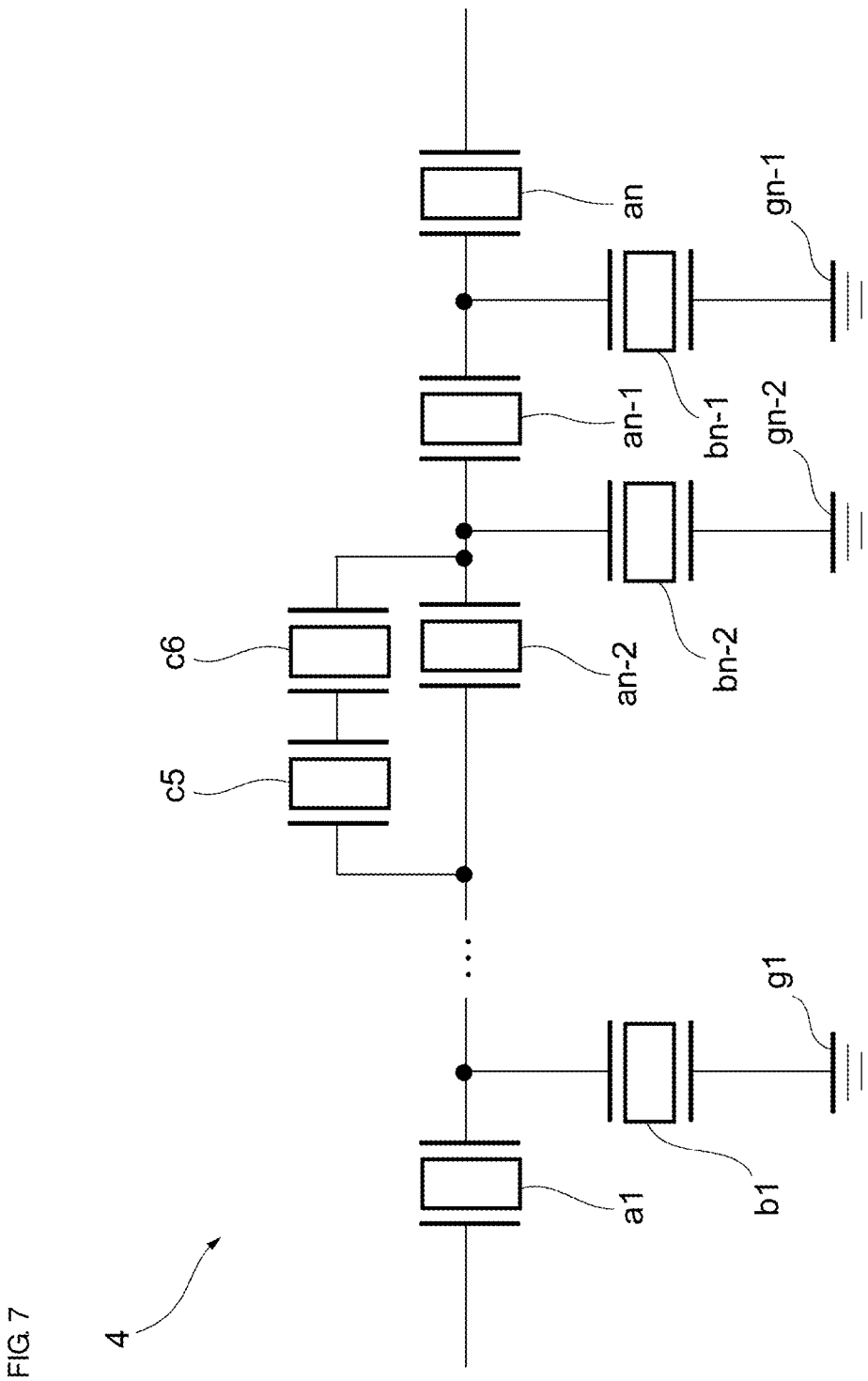
FIG. 7 is a diagram showing a transmission filter circuit according to a fourth preferred embodiment of the present invention.

FIG. 2 is a diagram showing the transmission filter circuit 1 according to the first preferred embodiment. The right-side end portion of the transmission filter circuit 1 shown in FIG. 2 is electrically connected to the transmission input terminal T1. The left-side end portion of the transmission filter circuit 1 is electrically connected to the common terminal T3. The right-side end portions of transmission filter circuits, described below with reference to FIGS. 5 to 7, are similarly electrically connected to the transmission input terminal T1 and the left-side end portions of the transmission filter circuits are similarly electrically connected to the common terminal T3.

The transmission filter circuit 1 according to the first preferred embodiment is a ladder filter circuit in which a plurality of resonators are electrically connected in series and in parallel with each other. Specifically, the transmission filter circuit 1 includes n number of first resonators a1 in a series arm and n−1 number of second resonators b1 to bn−1. Each of the second resonators b1 to bn−1 is electrically connected to one of ground terminals g1 to gn−1. For example, the second resonator b1 is electrically connected to the ground terminal g1. The transmission filter circuit 1 according to the first preferred embodiment further includes a third resonator c1 electrically connected in parallel with the first resonator an−2 that is third-nearest to the transmission input terminal T1 of the first resonators.

The numbers of the first resonators, the second resonators, and the third resonators are examples only, and are not limited to the numbers provided above. Components defining the first resonators a1 to an, the second resonators b1 to bn−1, and the third resonator c1 are not particularly limited, but may preferably be, for example, surface acoustic wave (SAW) filters, filters such as piezoelectric thin film resonators, or bulk acoustic wave (BAW) filters.

Figure 3:
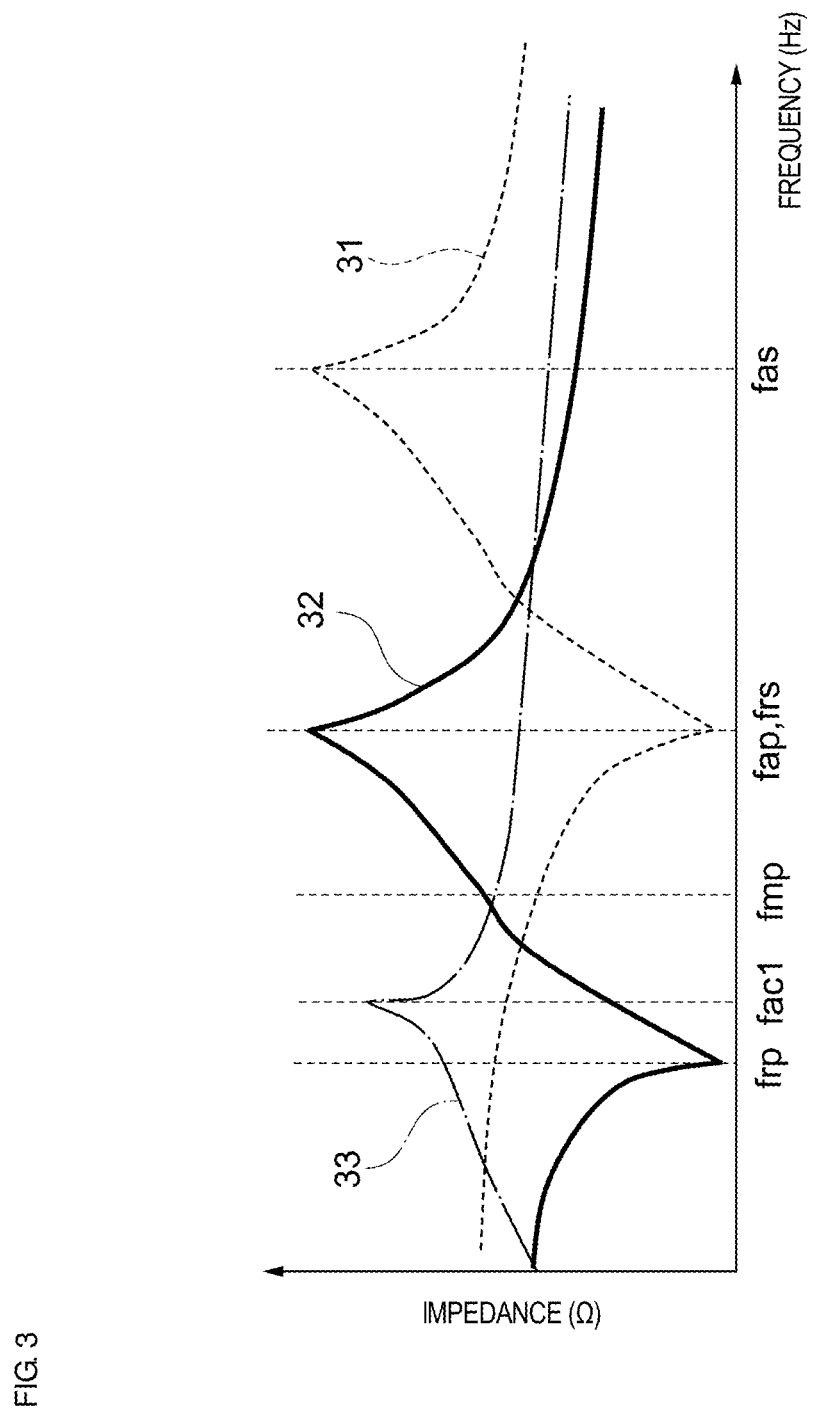
FIG. 3 is a graph showing impedance frequency characteristics of first to third resonators.

FIG. 3 is a graph showing impedance frequency characteristics of the first resonators, the second resonators, and the third resonator. First impedance characteristics 31 represented by a broken line are the impedance frequency characteristics of the first resonators a1 to an. Second impedance characteristics 32 represented by a solid line are the impedance frequency characteristics of the second resonators b1 to bn−1. Third impedance characteristics 33 represented by a dot-and-dash line are the impedance frequency characteristics of the third resonator c1.

Although descriptions will be provided on the assumption that the first resonators a1 to an have the same or substantially the same impedance characteristics to simplify the explanation in the first preferred embodiment, the first resonators a1 to an may have different impedance characteristics. Similarly, although descriptions will be provided on the assumption that the second resonators b1 to bn−1 have the same or substantially the same impedance characteristics to simplify the explanation in the first preferred embodiment, the second resonators b1 to bn−1 may have different impedance characteristics.

More specifically, although descriptions will be provided on the assumption that resonant frequencies frs1 to frsn of the first resonators a1 to an are frs in the first preferred embodiment, the resonant frequencies frs1 to frsn may be different from each other. Although descriptions will be provided on the assumption that anti-resonant frequencies fas1 to fasn of the first resonators a1 to an are fas in the first preferred embodiment, the anti-resonant frequencies fas1 to fasn may be different from each other. Although descriptions will be provided on the assumption that resonant frequencies frp1 to frpn−1 of the second resonators b1 to bn−1 are frp in the first preferred embodiment, the resonant frequencies frp1 to frpn−1 may be different from each other. Although descriptions will be provided on the assumption that anti-resonant frequencies fap1 to fapn−1 of the second resonators b1 to bn−1 are fap in the first preferred embodiment, the anti-resonant frequencies fap1 to fapn−1 may be different from each other.

In the first impedance characteristics 31, the lowest impedance is provided at the resonant frequency frs and the highest impedance is provided at the anti-resonant frequency fas. In the second impedance characteristics 32, the lowest impedance is provided at the resonant frequency frp and the highest impedance is provided at the anti-resonant frequency fap. In the third impedance characteristics 33, the lowest impedance is provided at a resonant frequency frc1 (not shown) of the third resonator c1 and the highest impedance is provided at an anti-resonant frequency fac1 of the third resonator c1. The relationship among these frequencies satisfies the following expressions (1) and (2).

$$frp < fac1 < fmp < fap < fas \quad (1)$$

$$frc1 < frp < frs \quad (2)$$

Here, fmp is a value determined by dividing the sum of the resonant frequency frp and the anti-resonant frequency fap of the second resonator by 2. The anti-resonant frequency fap of the second resonator is equal or substantially equal to the resonant frequency frs of the first resonator. Although the anti-resonant frequency fac1 of the third resonator c1 is lower than the anti-resonant frequency fap of the second resonator in FIG. 3 and expression (1), they may be equal or substantially equal to each other.

The relationships represented by expressions (1) and (2) may be applied to the case where the impedance characteristics of the first resonators a1 to an differ from one another and may also be applied to the case where the impedance characteristics of the second resonators b1 to bn−1 differ from one another. Specifically, on the condition that values determined by dividing the sums of the resonant frequencies and the anti-resonant frequencies of the second resonators b1 to bn−1 by 2 are fmp1 to fmpn−1, the resonant frequencies and the anti-resonant frequencies of the first resonators a1 to an, the second resonators b1 to bn−1, and the third resonator c1 and the values determined by dividing the sums of the resonant frequencies and the anti-resonant frequencies by 2 satisfy the following relational expression (3).

$$(frp1 \text{ to } frpn-1) \leq fac1 < (fmp1 \text{ to } fmpn-1) < (fap1 \text{ to } fapn-1) \quad (3)$$

As shown in expression (3), the anti-resonant frequency fac1 of the third resonator c1 is higher than or substantially equal to the highest one of the resonant frequencies frp1 to frpn−1 of the second resonators b1 to bn−1. The anti-resonant frequency fac1 is lower than all of the anti-resonant frequencies fap1 to fapn−1 of the second resonators b1 to bn−1. In addition, the anti-resonant frequency fac1 is lower than all of fmp1 to fmpn−1 determined by dividing the sums of the resonant frequencies and the anti-resonant frequencies of the second resonators b1 to bn−1 by 2.

In the first preferred embodiment, the frequencies described above also satisfy the following expression (4).

$$frc1 < (frp1 \text{ to } frpn-1) < (frs1 \text{ to } frsn) \quad (4)$$

That is, the resonant frequency frc1 of the third resonator c1 is lower than all of the resonant frequencies frp1 to frpn−1 of the second resonators b1 to bn−1. All of the resonant frequencies frp1 to frpn−1 of the second resonators b1 to bn−1 are lower than all of the resonant frequencies frs1 to frsn of the first resonators a1 to an.

The first resonators, the second resonators, and the third resonator include respective comb-shaped electrodes. The electrostatic capacitances of these resonators including respective comb-shaped electrodes (that is, the electrostatic capacitance of each resonator) are hereinafter referred to as inter digital transducer (IDT) capacitances. On the condition that the IDT capacitances of the second resonators b1 to bn−1 are Cb1 to Cbn−1 and the IDT capacitance of the third resonator c1 (that is, the combined capacitance of the third resonator c1) is Cc1, the following expression (5) is satisfied in the first preferred embodiment.

$$Cc1 < (Cb1 \text{ to } Cbn-1) \quad (5)$$

That is, the IDT capacitance Cc1 of the third resonator c1 is lower than all of the IDT capacitances Cb1 to Cbn−1 of the second resonators b1 to bn−1. Therefore, the Q value of the third resonator c1 is able to be set to be greater than all of the Q values of the second resonators b1 to bn−1.

1-3. Insertion Loss of Transmission Filter Circuit

Figure 4:
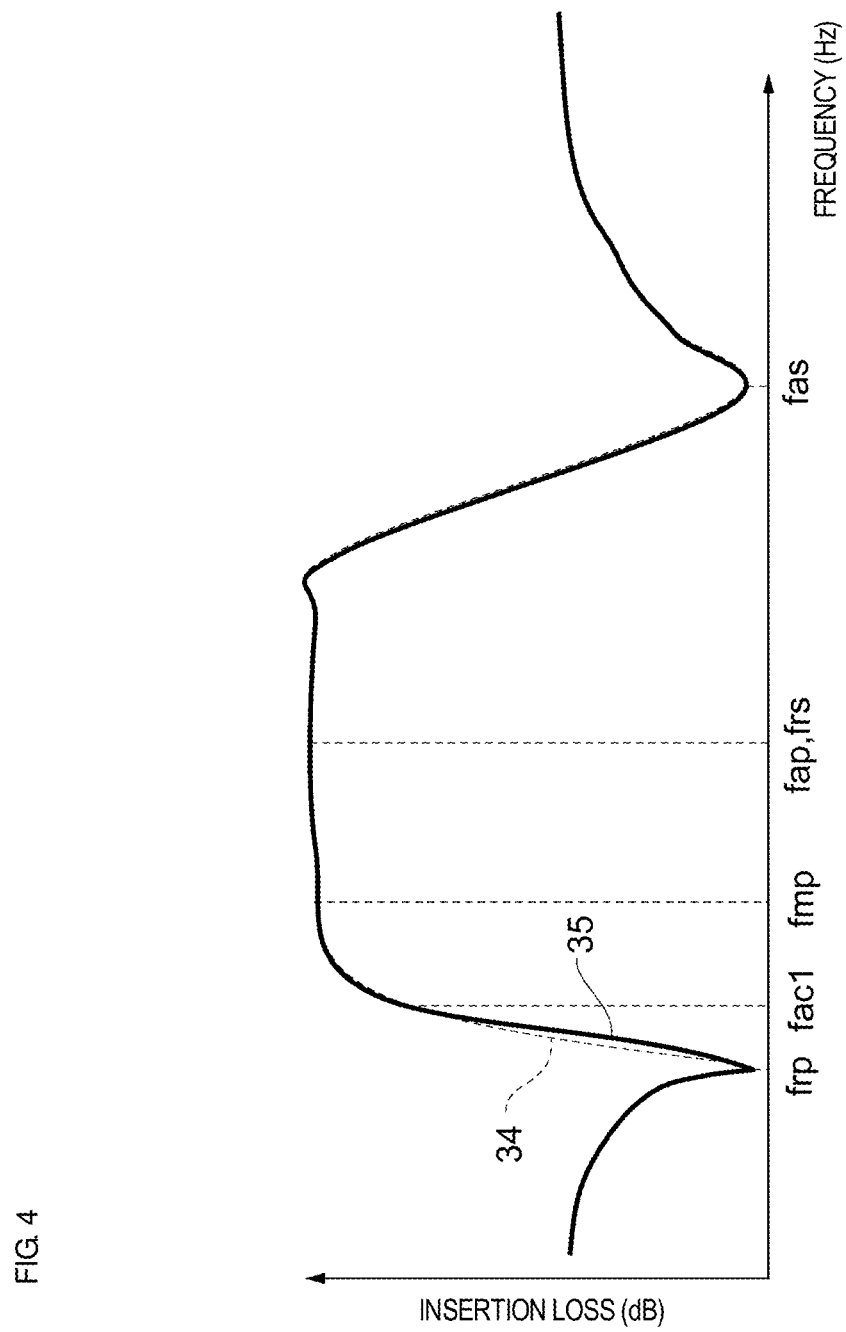
FIG. 4 is a graph showing insertion loss frequency characteristics of a transmission filter circuit according to the first preferred embodiment of the present invention.

FIG. 4 is a graph showing second loss characteristics 35 that are the insertion loss frequency characteristics of the transmission filter circuit 1 shown in FIG. 2. For comparison, first loss characteristics 34 that are the insertion loss frequency characteristics of a transmission filter circuit not including the third resonator c1 are represented by a broken line in FIG. 4. At frequencies lower than or substantially equal to frp and frequencies higher than or substantially equal to fac1, the first loss characteristics 34 and the second loss characteristics 35 substantially coincide with each other.

The first loss characteristics 34 and the second loss characteristics 35 have poles at the resonant frequency frp of the second resonator and the anti-resonant frequency fas of the first resonator. That is, in the first loss characteristics 34 and the second loss characteristics 35, lower-frequency side cut-off characteristics are provided with the resonant frequencies frp1 to frpn−1 of the second resonators b1 to bn−1 and higher-frequency side cut-off characteristics are provided with the anti-resonant frequencies fas1 to fasn of the first resonators a1 to an.

As described above, the transmission filter circuit 1 according to the first preferred embodiment includes the third resonator c1 having the anti-resonant frequency fac1. The anti-resonant frequency fac1 of the third resonator c1 is lower than all of the anti-resonant frequencies fap1 to fapn−1 of the second resonators b1 to bn−1. The IDT capacitance Cc1 of the third resonator c1 is lower than all of the IDT capacitances Cb1 to Cbn−1 of the second resonators b1 to bn−1. Therefore, the Q value of the third resonator c1 is able to be set to be greater than all of the Q values of the second resonators b1 to bn−1. Accordingly, on the lower-frequency side of the pass band, the cut-off characteristics of the transmission filter circuit 1 are significantly improved.

Specifically, in the second loss characteristics 35, cut-off characteristics sharper than those provided in the first loss characteristics 34 are provided at frequencies lower than the anti-resonant frequencies fap1 to fapn−1 of the second resonators b1 to bn−1, more specifically, at frequencies from the resonant frequency frp to the anti-resonant frequency fac1.

In the first preferred embodiment, the anti-resonant frequency fac1 of the third resonator c1 is higher than or substantially equal to the resonant frequency frp of the second resonator. Accordingly, at frequencies higher than or substantially equal to the resonant frequency frp in the second loss characteristics 35 of the transmission filter circuit 1, cut-off characteristics are able to be significantly improved with more certainty. When impedance becomes high because of the antiresonance of the third resonator c1, impedance matching is not able to be performed for a signal of a frequency at which impedance is high. The signal is therefore reflected and is not able to pass. As a result, cut-off characteristics are able to be significantly improved with more certainty.

In the first preferred embodiment, the anti-resonant frequency fac1 of the third resonator c1 is lower than fmp1 to fmpn−1 that are values determined by dividing the sums of the resonant frequencies and the anti-resonant frequencies of the second resonators b1 to bn−1 by 2. Accordingly, on the lower-frequency side in the second loss characteristics 35 of the transmission filter circuit 1, cut-off characteristics are able to be significantly improved with more certainty.

In the first preferred embodiment, the third resonator is electrically connected in parallel with none of the first resonator nearest to the transmission input terminal T1 and the first resonator a1 nearest to the transmission output terminal of the at least three first resonators a1 in the series arm. In general, a higher voltage is easily transitionally applied to a component closer to a terminal. Since the third resonator is electrically connected in parallel with none of the first resonator nearest to the transmission input terminal T1 and the first resonator a1 nearest to the transmission output terminal, the transient application of a high voltage to the third resonator is therefore able to be prevented. As a result, the withstand voltage of the transmission filter circuit 1 is able to be significantly improved.

2. Second Embodiment

In a second preferred embodiment of the present invention, descriptions of features, components, and elements common to those in the first preferred embodiment will be omitted and only different points will be described.

FIG. 5 is a diagram showing a transmission filter circuit 2 according to the second preferred embodiment of the present invention. The difference of the transmission filter circuit 2 according to the second preferred embodiment from that of the transmission filter circuit 1 according to the first preferred embodiment is that a third resonator c2 is electrically connected in parallel with the first resonator an−1 second-nearest to the transmission input terminal T1. As compared with the case where a single third resonator is electrically connected to the first resonator, the cut-off characteristics of the transmission filter circuit 2 on the lower-frequency side are able to be significantly improved.

The anti-resonant frequency fac1 and an anti-resonant frequency fac2 of the two third resonators c1 and c2 are lower than all of the anti-resonant frequencies fap1 to fapn−1 of the second resonators b1 to bn−1. The IDT capacitance Cc1 and an IDT capacitance Cc2 of the two third resonators c1 and c2 are lower than all of the IDT capacitances Cb1 to Cbn−1 of the second resonators b1 to bn−1. Accordingly, cut-off characteristics are able to be significantly improved on the lower-frequency side in the insertion loss of the transmission filter circuit 2.

The anti-resonant frequencies fac1 and fac2 of the two third resonators c1 and c2 may differ from each other. By setting the anti-resonant frequencies fac1 and fac2 to be different from each other, cut-off characteristics are able to be significantly improved in a wider frequency range on the lower-frequency side in the insertion loss frequency characteristics.

The anti-resonant frequencies fac1 and fac2 of the two third resonators c1 and c2 may be higher than or substantially equal to the highest one of the resonant frequencies frp1 to frpn−1 of the second resonators b1 to bn−1. Accordingly, cut-off characteristics are able to be significantly improved on the lower-frequency side in the insertion loss of the transmission filter circuit 2 with more certainty.

Although the transmission filter circuits 2 to which the two third resonators c1 and c2 are electrically connected has been described in the second preferred embodiment, the number of the third resonators electrically connected to the transmission filter circuit does not necessarily have to be two and may be three or more. At that time, by setting the anti-resonant frequencies of three or more resonators to be different from one another, cut-off characteristics are able to be significantly improved in a wider frequency range on the lower-frequency side in the insertion loss of the transmission filter circuit 2.

By increasing the number of the third resonators, cut-off characteristics are able to be significantly improved in a wider frequency range on the lower-frequency side in the insertion loss of the transmission filter circuit 2. However, the increase in the number of the third resonators increases the insertion loss. Accordingly, the number of the third resonators may be designed as appropriate in consideration of the balance between the degree of the insertion loss and cut-off characteristics.

3. Third Embodiment

In a third preferred embodiment of the present invention, descriptions of features, components, and elements common to those in the first preferred embodiment will be omitted and only different points will be described.

FIG. 6 is a diagram showing a transmission filter circuit 3 according to the third preferred embodiment of the present invention. In the transmission filter circuit 3 according to the third preferred embodiment, two third resonators c3 and c4 electrically connected in parallel with each other are electrically connected to the first resonator an−2 third-nearest to the transmission input terminal T1. Anti-resonant frequencies fac3 and fac4 of the two third resonators c3 and c4 are lower than all of the anti-resonant frequencies fap1 to fapn−1 of the second resonators b1 to bn−1. The combined capacitance of IDT capacitances Cc3 and Cc4 of the two third resonators c3 and c4 is smaller than all of the IDT capacitances Cb1 to Cbn−1 of the second resonators b1 to bn−1. Accordingly, cut-off characteristics are able to be significantly improved on the lower-frequency side in the insertion loss of the transmission filter circuit 3.

The anti-resonant frequencies fac3 and fac4 of the two third resonators c3 and c4 may differ from each other. By setting the anti-resonant frequencies fac3 and fac4 to be different from each another, cut-off characteristics are able to be significantly improved in a wider frequency range on the lower-frequency side in the insertion loss frequency characteristics.

The anti-resonant frequencies fac3 and fac4 of the two third resonators c3 and c4 may be higher than or substantially equal to the highest one of the resonant frequencies frp1 to frpn−1 of the second resonators b1 to bn−1. Accordingly, cut-off characteristics are able to be significantly improved on the lower-frequency side in the insertion loss of the transmission filter circuit 3 with more certainty.

In the transmission filter circuit 3 according to the third preferred embodiment, the third resonators c3 and c4 are electrically connected to the first resonator an−2 third-nearest to the transmission input terminal T1. However, the third resonators electrically connected in parallel with each other may be electrically connected to any one of the first resonators a1 to an.

In the transmission filter circuit 3 according to the third preferred embodiment, the two third resonators c3 and c4 electrically connected in parallel with each other are electrically connected to the first resonator an−2. However, the three or more third resonators electrically connected in parallel with one another may be electrically connected to the first resonator. In addition, the two or more third resonators electrically connected in parallel with each other may be electrically connected in parallel with each of the first resonators. The anti-resonant frequencies of at least two or more of these third resonators may differ from each other. Accordingly, cut-off characteristics are able to be significantly improved in a wider frequency range on the lower-frequency side in the insertion loss frequency characteristics.

In a fourth preferred embodiment of the present invention, descriptions of features, components, and elements common to those in the first preferred embodiment will be omitted and only different points will be described.

FIG. 7 is a diagram showing a transmission filter circuit 4 according to the fourth preferred embodiment. In the transmission filter circuit 4 according to the fourth preferred embodiment, two third resonators c5 and c6 electrically connected in series with each other are electrically connected in parallel with the first resonator an−2 third-nearest to the transmission input terminal T1.

Anti-resonant frequencies fac5 and fac6 of the two third resonators c5 and c6 are lower than all of the anti-resonant frequencies fap1 to fapn−1 of the second resonators b1 to bn−1. The combined capacitance of IDT capacitances Cc5 and Cc6 of the third resonators c5 and c6 is smaller than all of the IDT capacitances Cb1 to Cbn−1 of the second resonators b1 to bn−1. Accordingly, cut-off characteristics are able to be significantly improved on the lower-frequency side in the insertion loss of the transmission filter circuit 4.

The anti-resonant frequencies fac5 and fac6 of the two third resonators c5 and c6 may be higher than or substantially equal to the highest one of the resonant frequencies frp1 to frpn−1 of the second resonators b1 to bn−1. Accordingly, cut-off characteristics are able to be significantly improved on the lower-frequency side in the insertion loss of the transmission filter circuit 4 with more certainty.

The anti-resonant frequencies fac5 and fac6 of the two third resonators c5 and c6 may differ from each other. By setting the anti-resonant frequencies fac5 and fac6 to be different from each another, cut-off characteristics are able to be significantly improved in a wider frequency range on the lower-frequency side in the insertion loss of the transmission filter circuit 4.

In the transmission filter circuit 4 according to the fourth preferred embodiment, the two third resonators c5 and c6 electrically connected in series with each other are electrically connected to the single first resonator an−2. However, the three or more third resonators electrically connected in series with one another may be electrically connected in parallel with the first resonator. Accordingly, cut-off characteristics are able to be significantly improved in a wider frequency range on the lower-frequency side in the insertion loss frequency characteristics.

In the transmission filter circuit 4 according to the fourth preferred embodiment, the third resonators c5 and c6 are electrically connected to the first resonator an−2 third-nearest to the transmission input terminal T1. However, the third resonators electrically connected in series with each other may be electrically connected to any one of the first resonators a1 to an. The third resonators electrically connected in series with each other may be electrically connected in parallel with the respective first resonators.

The preferred embodiments described above are intended to help easily understand the present invention and is not to be used to construe the present invention in a limiting manner. The elements, the arrangement thereof, the materials, the conditions, the shapes, the sizes, and the like in the preferred embodiments are not limited to those shown and described, and may be modified as appropriate. Furthermore, the features, components, and elements described in the different preferred embodiments are able to be partly replaced or combined.

In the preferred embodiments, the case has been described where the anti-resonant frequency of the third resonator is lower than all of the anti-resonant frequencies fap1 to fapn−1 of the second resonators b1 to bn−1. However, the anti-resonant frequency of the third resonator may be higher than or substantially equal to at least one of the anti-resonant frequencies fap1 to fapn−1 of the second resonators b1 to bn−1. Accordingly, the anti-resonant frequency of this third resonator is lower than at least one of the anti-resonant frequencies fap1 to fapn−1 of the second resonators b1 to bn−1.

In the preferred embodiments, the case has been described where a filter circuit according to a preferred embodiment of the present invention is applied to a transmission filter included in a duplexer. However, a filter circuit according to a preferred embodiment of the present invention may be applied to a reception filter included in a duplexer or both of a transmission filter and a reception filter.

In the preferred embodiments, the case has been described where a filter circuit according to a preferred embodiment of the present invention is applied to a duplexer. However, a filter circuit according to a preferred embodiment of the present invention may be applied to various composite filter devices each including a plurality of filter circuits. Examples of a composite filter device may include the above-described duplexer that is a composite component of two filter circuits, a triplexer that is a composite component of three filter circuits, a quadplexer that is a composite component of four filter circuits, and an octoplexer that is a composite component of eight filter circuits. Accordingly, at least one of the filter circuits in the composite filter device is a filter circuit according to a preferred embodiment of the present invention.

The components in the above-described composite filter device may be provided on the same chip as a module or may be provided on separate chips.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter circuit comprising:
   a plurality of first resonators provided in a series arm;
   a plurality of second resonators provided in a parallel arm; and
   at least one or more third resonators that are electrically connected in series with each other and are electrically connected in parallel with the plurality of first resonators in the series arm; wherein
   an anti-resonant frequency of the at least one or more third resonators is lower than an anti-resonant frequency of the plurality of second resonators; and
   a combined capacitance of the at least one or more third resonators electrically connected in series with each other is smaller than an electrostatic capacitance of the plurality of second resonators.

2. The filter circuit according to claim 1, wherein the anti-resonant frequency of the at least one or more third resonators is higher than or substantially equal to a resonant frequency of the plurality of second resonators.

3. The filter circuit according to claim 2, wherein the at least one or more third resonators electrically connected in series with each other are electrically connected in parallel with at least one of the plurality of first resonators.

4. The filter circuit according to claim 2, wherein the at least one or more third resonators electrically connected in parallel with each other are electrically connected to the plurality of first resonators.

5. The filter circuit according to claim 1, wherein the anti-resonant frequency of the at least one or more third resonators is lower than an anti-resonant frequency of each of the plurality of second resonators.

6. The filter circuit according to claim 5, wherein the at least one or more third resonators electrically connected in series with each other are electrically connected in parallel with at least one of the plurality of first resonators.

7. The filter circuit according to claim 5, wherein the at least one or more third resonators electrically connected in parallel with each other are electrically connected to the plurality of first resonators.

8. The filter circuit according to claim 1, wherein the anti-resonant frequency of the at least one or more third resonators is lower than a value determined by dividing a sum of a resonant frequency and the anti-resonant frequency of the plurality of second resonators by 2.

9. The filter circuit according to claim 1, wherein
   an input terminal is provided at one end of the series arm and an output terminal is provided at the other end of the series arm;
   the plurality of first resonators include at least three first resonators;
   the at least three first resonators are provided in the series arm; and
   the at least one or more third resonators are electrically connected in parallel with none of the plurality of first resonators, one of which is nearest to the input terminal and another one of which is nearest to the output terminal of the at least three first resonators.

10. The filter circuit according to claim 1, wherein the at least one or more third resonators are electrically connected in parallel with each of at least two of the plurality of first resonators.

11. The filter circuit according to claim 1, wherein the at least one or more third resonators electrically connected in series with each other are electrically connected in parallel with at least one of the plurality of first resonators.

12. The filter circuit according to claim 1, wherein the at least one or more third resonators electrically connected in parallel with each other are electrically connected to the plurality of first resonators.

13. A composite filter device comprising:
a reception filter; and
a transmission filter; wherein
at least one of the reception filter and the transmission filter is the filter circuit according to claim 1.

14. The composite filter device according to claim 13, wherein
the reception filter is connected to a reception output terminal and a common terminal;
the transmission filter is connected to a transmission input terminal and the common terminal; and
the common terminal defines and functions as a transmission output terminal of the transmission filter and a reception input terminal of the reception filter.

15. The composite filter device according to claim 14, wherein the common terminal is electrically connected to an antenna.

16. The filter circuit according to claim 1, wherein the plurality of first resonators, the plurality of second resonators, and the at least one or more third resonators are surface acoustic wave (SAW) filters, piezoelectric thin film resonators, or bulk acoustic wave (BAW) filters.

17. The filter circuit according to claim 1, wherein
a lowest impedance of the plurality of first resonators is provided at a resonant frequency of the plurality of first resonators; and
a highest impedance of the plurality of first resonators is provided at an anti-resonant frequency of the plurality of first resonators.

18. The filter circuit according to claim 1, wherein each of the plurality of first resonators, each of the plurality of second resonators, and each of the at least one or more third resonators includes a comb-shaped electrode.

19. The filter circuit according to claim 1, wherein a Q value of one of the at least one or more third resonators is greater than a Q value of any of the plurality of second resonators.

20. The filter circuit according to claim 1, wherein
the at least one or more third resonators include a first third resonator and a second third resonator; and
an anti-resonant frequency of the first third resonator is different from an anti-resonant frequency of the second third resonator.

* * * * *